(12) United States Patent
Berry et al.

(10) Patent No.: US 7,086,026 B2
(45) Date of Patent: Aug. 1, 2006

(54) DECOUPLING CAPACITANCE ANALYSIS METHOD

(75) Inventors: Christopher J. Berry, Mellenville, NY (US); Howard H. Smith, Beacon, NY (US); Richard P. Underwood, Fishkill, NY (US); Alan P. Wagstaff, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 10/436,393

(22) Filed: May 12, 2003

(65) Prior Publication Data
US 2004/0230926 A1    Nov. 18, 2004

(51) Int. Cl.
*G06F 17/50* (2006.01)
(52) U.S. Cl. .................................. 716/10; 716/2; 716/4
(58) Field of Classification Search .................... 716/2, 716/4–5, 7, 10
See application file for complete search history.

(56) References Cited

U.S. PATENT DOCUMENTS 6,085,032 A * 7/2000 Scepanovic et al. .......... 716/10
6,323,050 B1 * 11/2001 Dansky et al. ................ 438/17

* cited by examiner

*Primary Examiner*—Stacy A Whitmore
(74) *Attorney, Agent, or Firm*—Lynn L. Augspurger

(57) ABSTRACT

This method for decoupling capacitance analysis improves upon existing techniques to attempt to give a more accurate representation of the power supply fluctuations on a chip while keeping runtime comparable. This method employs the following techniques:

1. A method for descending through hierarchy and dividing the design into a variable sized grid.
2. An algorithm to determine which grid locations of a design don't have enough decoupling capacitors for all of the devices in that grid location.
3. An algorithm to determine which grid locations are subject to harmful neighboring effects.
4. A method to display the results of the calculations in a graphical manor to allow easy identification of problem areas.

4 Claims, 4 Drawing Sheets

LEGEND
- LATCH
- DECAP

DECOUPLING CAPACITANCE ANALYSIS METHOD

FIELD OF THE INVENTION

This invention relates to an automated method for evaluating decoupling capacitance in an integrated chip design and more particularly to a method of analysis of the local effects of decoupling capacitors on voltage droop caused by circuit design of devices and for obtaining results that identifies areas of potential voltage droop in a circuit design.

Trademarks: IBM® is a registered trademark of International Business Machines Corporation, Armonk, N.Y., U.S.A. Other names may be registered trademarks or product names of International Business Machines Corporation or other companies.

BACKGROUND

Today, there are Very Large Scale Integrated (VLSI) circuits, herein referred to as chip(s), that have hundreds of millions of transistors with frequencies greater than 1 Gigahertz. In these chips there are many aspects of a design that have to be analyzed to verify that the design will function as intended. One aspect of this analysis is signal integrity. On VLSI chips there are many millions-of interconnections between devices. Each of these interconnections has a device(s) that is changing the state, or the signal, on the interconnection, herein called a driver(s), and a device(s) that is reading the signal from the interconnection, herein called a receiver(s). The signal that the driver sends can be distorted as it leaves the driver and affected as it travels along the interconnection to any of the receivers. Signal integrity can be explained as a measure of how distorted the signal is that arrives at the receiver versus what the driver intended to send to the receiver.

There are many interactions that can cause signal integrity to degrade. An assumption that is generally made in designing the devices that drive and receive the signals is that the supply voltage for any of the devices stays constant. In reality the supply voltage for all of the devices fluctuates. In the case when there is a high density of simultaneous switching circuits such as latches the power supply rail will collapse, resulting chip malfunctions or performance degradation. This power supply collapse is proportional to the number of devices in an area and inversely proportional to the area in which the devices reside. So, the higher the device density the greater the potential for the power supply to fluctuate.

One of the ways to counteract this power supply fluctuation is to add capacitance between the voltage and ground, referred to as decoupling capacitance(decap) in high-frequency chip designs. Quiescent circuits also provide decoupling capability but the decoupling capacitor or decaps is specifically designed to provide a much higher capacitance density, usually 5×–10× greater than a quiet circuit. Although these decaps provide significant increase in the total on-chip voltage rail capacitance, the effectiveness of these elements are greatly diminished as a function of the distance from the active circuits. Therefore there is a need to analyze whether the decoupling capacitors placement throughout the chip is located in close proximity with sufficient quantity to simultaneous switching circuits such that voltage supply fluctuations is contained within design specifications. U.S. Pat. No. 6,323,050 B1, "Method For Evaluating Decoupling Capacitor Placement for VLSI Chips", Allan H. Dansky, etal. has focused on custom chip designs such that lowest level entities are one of a kind macro circuits or group of basic circuit elements to make a function.

SUMMARY OF THE INVENTION

The preferred embodiment of this invention analyzes how effective a chip's decoupling capacitors are in stabilizing the power supply voltage under the condition in which it is assumed that latches are simultaneous switching circuits. More particularly we have provided an automated method for evaluating decoupling capacitance in an integrated chip design and an analysis of the local effects of decoupling capacitors on voltage droop caused by circuit design of devices and a process for obtaining results that identifies areas of potential voltage droop in a circuit design. We determine the required decoupling capacitor quantity and placement to minimize differential mode noise or power rail collapse due to local area density of simultaneous switching circuits such as latches. This process will also determine if prior decap and latch placement satisfies rail collapse requirements.

In accordance with our preferred embodiment, the analysis is preformed for circuits types known to be simultaneously switching in sufficient number to effect performance or signal integrity. The current techniques being described flattens through macro boundaries to identify all simultaneous switching circuit types for calculations.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

Figure 1:
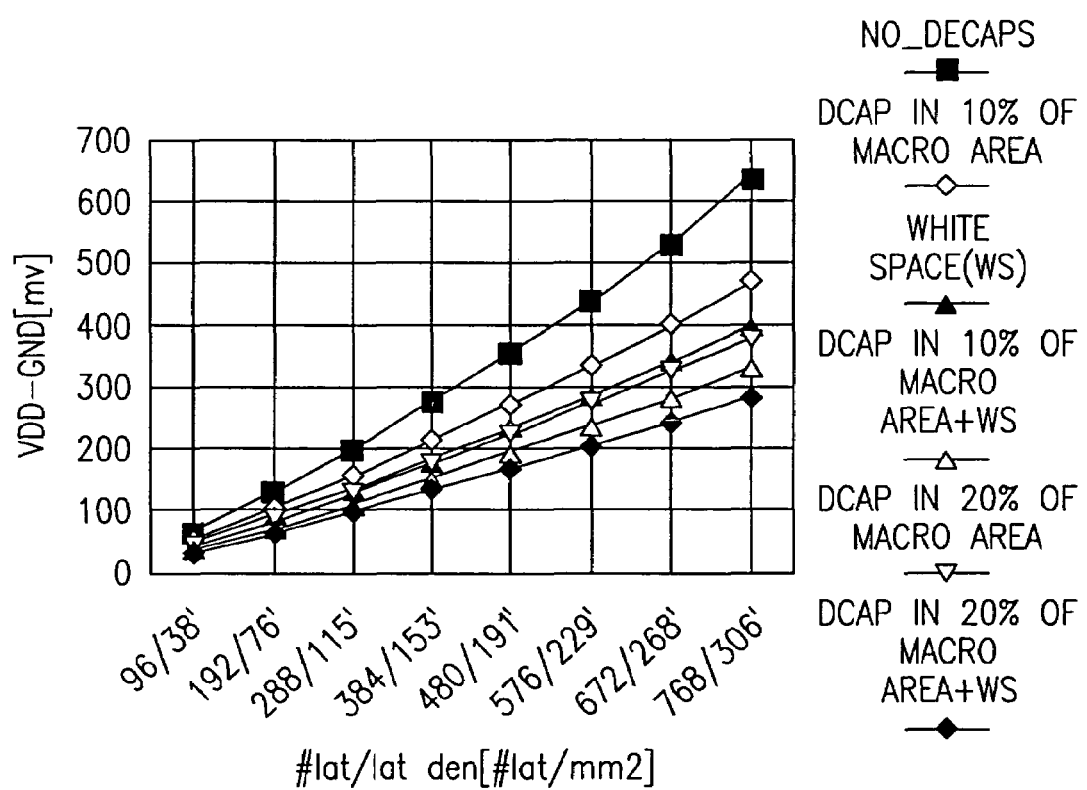
FIG. 1 Rail Collapse as a function of decap quantity latches count and density
Figure 2:
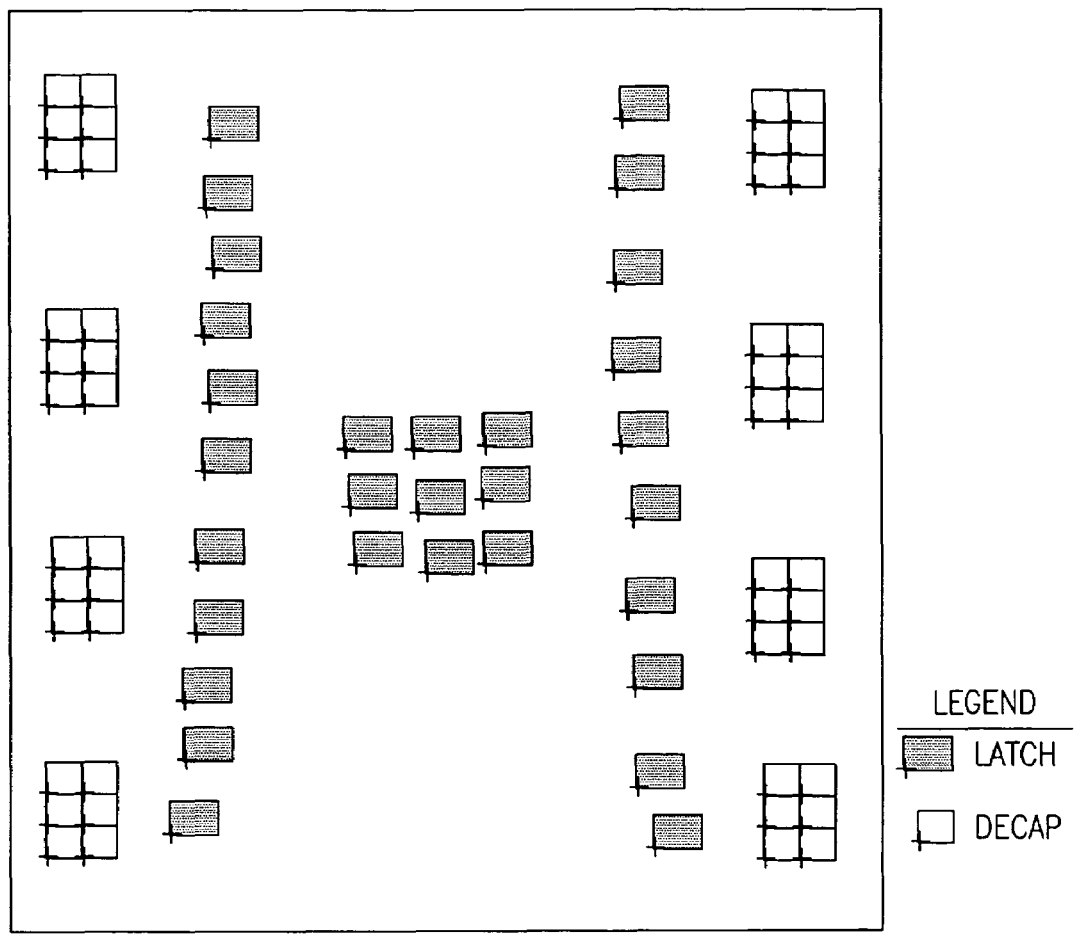
FIG. 2 illustrates a typical chip design
Figure 3:
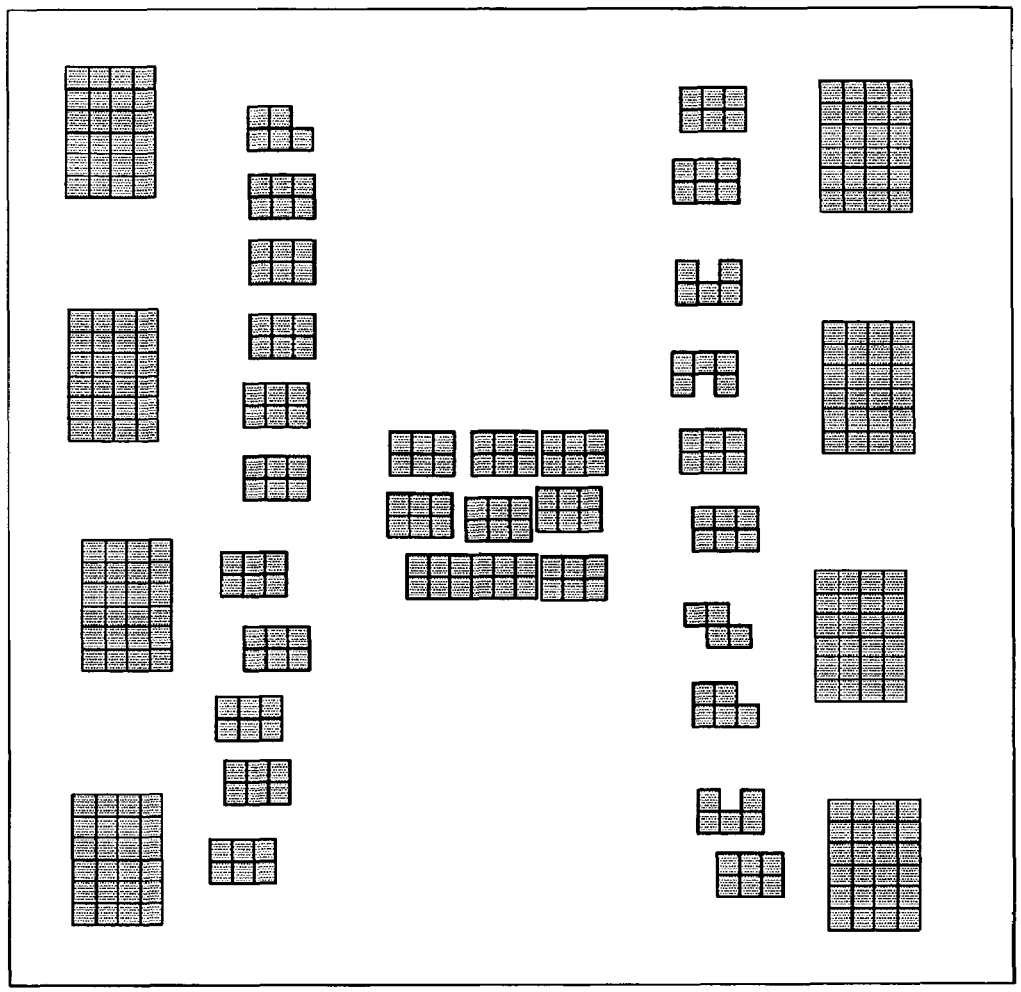
FIG. 3 illustrates an example of the final graphic
Figure 4:
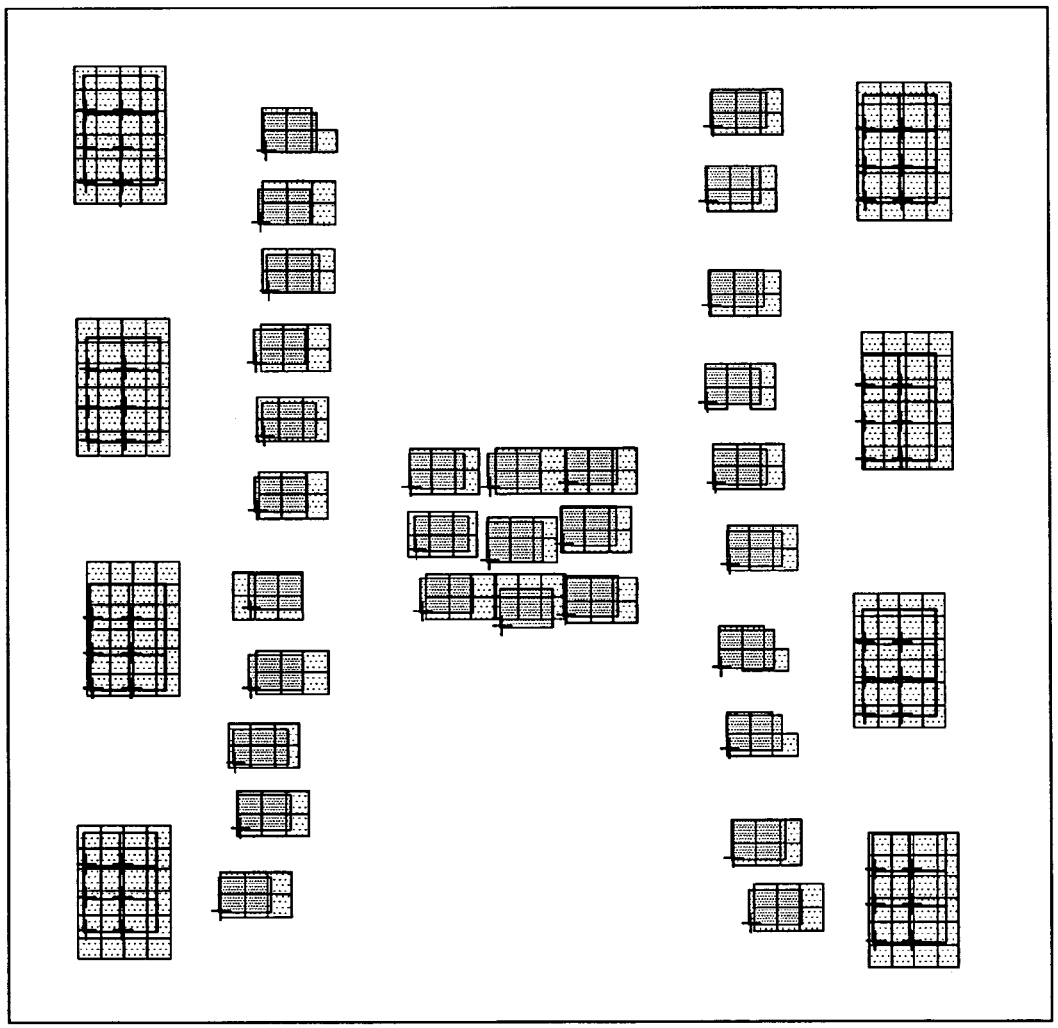
FIG. 4 illustrates the graphic of FIG. 2 overlaid onto FIG. 1

By way of introduction our method begins with circuit simulations using ASX or PwrSpice, two current process programs used by IBM (and available commercially) to characterize the power rail current signatures of all latch types in the circuit library of interest. Decoupling capacitors are categorized in terms of decap quantity, area and intrinsic time constants. Once circuits and decaps are characterized using a power rail analysis tool (which can be done for instance by using an IBM internal tool called ALSIM) to determine the power rail collapse as a function of latch count and decoupling quantity as illustrated in FIG. 1. The power rail collapse characterization is used as input for the calculation procedure for the latch and decap placement relationship in the actual chip design.

One of our improvements upon previous methods is obtained with an algorithm which can handle an entire chip without hierarchy. "Without hierarchy" being used here in reference to a chip with basic logical devices, or gates, not individual transistors. This can either be the way that the chip was designed, as many Application Specific Integrated Circuits (ASIC) are, or levels of hierarchy can be "looked through" to determine where the locations of all the latches and capacitors are placed. The reason for stopping at the book level is to be able to abstract the problem.

The basic concept for this method is that any given capacitor in a design has a useful range and an amount of useful capacitance. Each latch in a design has an amount of capacitance that it uses when it changes state and each capacitor has an amount of capacitance that it can supply to a latch when it is changing state. The closer a latch is to a capacitor the more effective that capacitor is at maintaining the power supply voltage in the area of the latch. Any given capacitor only has a certain amount of capacitance that can be used by latches in it's vicinity. Once that capacitance is used by latches, it can't be used by other latches.

The second part to our method is directed to assessment of the affect of one area's voltage fluctuations, or voltage droop, on other adjacent areas. Due to the fact that most VLSI designs have a power grid for the power supply to get to the devices, adjacent areas have an affect on each other. If one area has a large amount of voltage droop then it is going to cause other nearby areas to experience more voltage droop. Essentially, as one area uses more power than that area of the grid can accommodate the grid compensates by pulling power from other areas. When the power grid does this it is essentially taking the power away from the adjacent areas of the chip. And, subsequently, if the area that the grid is taking the power away from is also using more of it's power than it's grid can supply they are both worse than they were originally. The method described approximates this effect and alters the estimated voltage droop accordingly.

Our techniques when compared to prior techniques allow for more accurate assessments of the effectiveness of the capacitors in a given area. The resolution of this method is much higher and works on an entire chip as opposed to individual blocks on a chip. It also takes block-to-block effects into account which previous methods which we have considered don't handle.

Turning now to the invention in more detail it will be understood that our method examines a VLSI design to create a data structure that represents all of the decoupling capacitors and all of the latches in the design, keeping track of their chip level coordinates and capacitance values. The capacitance values of decoupling capacitors is proportional to the charge stored by the capacitor. The capacitance values of the latches is proportional to the worst case charge used by the latch when the latch loads a new value. The values are stored such that the stored charge values and needed charge values reduce in magnitude when combined. For example, the capacitor values could have a positive number, while latches could have a negative number.

The data structure organizes the capacitance values in a two dimensional array. The indices of the array can be decoded to a specific location on the chip, and the value in the array represents the capacitance found in an area around that location. The size of this area can be adjusted to trade off accuracy for performance. If the granularity is fine enough, each capacitor and latch are represented uniquely in the array. As the granularity is increased, the ability to account for local effects is reduced, however the volume of data and running time can be drastically reduced.

After the data structure has been populated with the values of the devices of interest, analysis can be performed. Analysis begins by first finding a decoupling capacitor. After the decoupling capacitor is found, an area of interest is calculated from the radius of effectiveness. The radius of effectiveness is the distance at which the capacitor can maintain supply voltage for a latch that is switching. For each latch found in the area of interest, the latch and the decoupling capacitor are combined, accounting for transmission distance. The effect of the latch is reduced to 0 if there is enough unused charge left in the capacitor after account for the distance between the latch and the capacitor. If these requirements are met, the amount of unused charge in the capacitor is reduced by the amount used in the latch and the transmission distance factor to the latch. If there is not enough unused charge left in the capacitor, the unused charge is reduced to 0, and the latch is reduced by that amount after accounting for transmission distance. The process is repeated on the next latch in area of interest until there is no unused charge left in the capacitor, or there are no more latches in the area of interest. The above procedure is repeated for every decoupling capacitor in the design, updating the affected values in the array.

Next, the neighboring effect needs to be calculated for the design. Since the local effects have been taken care of the granularity of the array can be reduced. This also speeds up calculation and enables better modeling of the neighboring effect. To reduce-granularity, a new two dimensional array is created, with each dimension reduced by a constant factor. Each value in the new array represents a square region in the old array the same size as the factor used to create the new array. The values in the new array are populated by combining the values in this region, allowing decoupling capacitors and latches to cancel each other out. Using calculations described in the summary, it calculates the threshold for high risk for significant voltage fluctuation. Using this threshold on the new array, it calculates how many of each cell's neighbors cross this threshold. The more neighbors above the threshold, the more the threshold is reduced for this cell. This threshold is used to categorize each cell. This process is repeated for all of the cells in the new array.

Once all of the cells have been categorized, a final graph is produced indicating areas on the chip of concern. If the value in the final cell is above the threshold, the cell is highlighted in a particular color. If the value is below the threshold, a different color is used. The number of gradients used can be varied as necessary, however it is recommended to use at least three values: no voltage droop, less than the threshold voltage droop, and greater than the threshold voltage droop. This graph can be overlaid on the original design to indicate specific areas that need attention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for computing the local effects of decoupling capacitors on voltage droop caused by active devices by:
   computing the individual effects of active devices on voltage droop;
   computing the ability of capacitors to counteract the effect of active devices;
   scaling the ability of capacitors to counteract the effect of active devices by the distance from the active device to the capacitor;
   combining the total effect of each active device in the affected area to determine the effectiveness of each capacitive device, thereby providing analysis of the local effects of decoupling capacitors on voltage droop caused by circuit design of said active devices and for obtaining results that identifies areas of potential voltage droop in a circuit design.

2. The method of claim 1 wherein the distance is measured using a Euclidean distance measurement.

3. The method of claim 1 wherein the distance is measured using a Manhattan distance measurement.

4. The method of claim 1 wherein the list of active devices that affect the capacitor are sorted in order of increasing distance from the capacitor.

* * * * *